United States Patent
Waltari

(10) Patent No.: US 11,012,083 B1
(45) Date of Patent: May 18, 2021

(54) VOLTAGE-TO-TIME-TO-DIGITAL CONVERTER (VTDC) WITH COARSE ANALOG-TO-DIGITAL CONVERTER (ADC)

(71) Applicant: IQ-Analog Corporation, San Diego, CA (US)

(72) Inventor: Mikko Waltari, Escondido, CA (US)

(73) Assignee: IQ-Analog Corp., San Diego, CA (US)

( * ) Notice: Subject to any disclaimer, the term of this patent is extended or adjusted under 35 U.S.C. 154(b) by 0 days.

(21) Appl. No.: 17/169,598

(22) Filed: Feb. 8, 2021

Related U.S. Application Data

(63) Continuation-in-part of application No. 17/125,089, filed on Dec. 17, 2020, now Pat. No. 10,962,933.

(51) Int. Cl.
*H03M 1/06* (2006.01)
*G04F 10/00* (2006.01)

(52) U.S. Cl.
CPC ........ *H03M 1/0641* (2013.01); *G04F 10/005* (2013.01)

(58) Field of Classification Search
CPC ........ G04F 10/005; H03M 1/502; H03M 1/12
See application file for complete search history.

(56) References Cited

U.S. PATENT DOCUMENTS

| | | | |
|---|---|---|---|
| 6,788,132 B2 * | 9/2004 | Lim | G05F 1/465 327/535 |
| 8,487,806 B2 * | 7/2013 | Choi | H03M 1/50 341/166 |
| 10,614,741 B2 * | 4/2020 | Hashimoto | G09G 3/3233 |

* cited by examiner

*Primary Examiner* — Brian K Young
(74) *Attorney, Agent, or Firm* — Law Office of Gerald Maliszewski; Gerald Maliszewski

(57) ABSTRACT

A voltage-to-time-to-digital converter (VTDC) and conversion method are provided using a coarse analog-to-digital converter (ADC). A voltage-to-time converter (VTC) receives an analog input voltage-differential signal with a first time duration and supplies an analog first time-differential signal. An ADC receives the input voltage-differential signal and supplies a first digital code representing m bit values. A time-to-digital converter (TDC) receives a second time-differential signal with a second time duration derived from the first time duration. The TDC supplies an output digital code representing p bit values, where p>m. In one aspect the first digital code programs an initial set of TDC residue generators. In another aspect, a dither circuit controls the second time duration in response to a pseudo random signal combined with the first digital code.

19 Claims, 5 Drawing Sheets

VOLTAGE-TO-TIME-TO-DIGITAL CONVERTER (VTDC) WITH COARSE ANALOG-TO-DIGITAL CONVERTER (ADC)

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to analog-to-digital converter (ADC) and, more particularly, to voltage-to-time-to-digital converter (VTDC) systems and methods.

2. Description of the Related Art

FIG. 1 is a simplified schematic of an analog-to-digital converter (ADC) comprised of a voltage-to-time (V2T) converter (VTC) and a time-to-digital converter (TDC) based upon a single slope principle (prior art). The A-to-D conversion process is split in two steps. In the first step the input voltage is proportionally converted into a time domain signal using pulse position or pulse width modulation. In the case of a differential voltage signal, a time-differential signal is created. In the second step this time domain signal is digitized using a TDC. The advantage of this method is that most of the complexity of the design is in the TDC part, which can be implemented in digital, or digital-like circuitry that enjoys all the benefits of technology scaling in the CMOS process.

The governing principle in many TDCs is to convert an analog time domain input signal to its digital equivalent in several steps or stages, each producing one bit of digital information, along with an analog residue (remainder) signal that is passed on to be further processed in a subsequent step. In the end, the bits from all the stages are combined to make a final digital output word. Usually the residue formation is the most critical operation in terms of required accuracy, resource usage, and operating speed.

One commonly used TDC architecture is the gated ring-oscillator. It uses start and stop signals to define the time interval to be digitized. The start signal is used to start the oscillator and the stop signal is used to capture the state of the oscillator, and so determine its state at a sub-period level. A digital counter is used to count the number of full oscillator cycles. The speed of the counter limits the oscillation frequency, with higher resolution coming at the cost of increased power and circuit area. Another limitation of many conventional systems is that they are not truly time differential. While the measurement interval is defined to be the difference between the start and the stop signals, the start signal must always arrive before the stop signal. Thus, in a system using a pair of signals (two inputs), the start signal must always be carried on one predetermined line and the stop pulse always carried on the other line.

Another common technique used in ADCs and also adopted in TDCs is to perform a coarse, often only a single bit, conversion of the input signal, and then use its result to control the residue generation. While this easily yields a precise residue signal, the downside is that the residue generation cannot begin until after the coarse conversion result is ready. In practice, this means that the input signal to the residue generator has to be delayed while the coarse conversion is in progress. This common mode delay obviously limits the operating speed. In analog-to-digital converters delaying the voltage domain signal is trivial: the signal can be stored as a charge in a capacitor. In time domain processing, however, delaying a signal means passing it through a chain of delay elements that adds noise and consumes power. It would be advantageous if the common mode delay of a TDC could be reduced or even eliminated.

FIG. 2 is a schematic block diagram of a sort-and-delay residue generator stage (prior art). This circuitry is described in detail in U.S. Pat. No. 9,831,888, entitled Sort-and-Delay Time-to-Digital Converter, invented by Mikko Waltari, and is incorporated herein by reference. A single bit quantization of a time-differential input signal involves detecting which one of the two input time-differential signal components arrives first, or in other words, which signal component has a rising (or falling) edge earlier in time. This can be accomplished with an arrival time comparator (ATC) or a set-reset latch. The operation is essentially a zero crossing detection. Unfortunately, as mentioned above, delays must be used to await the results of the quantization decision.

In this single-bit per stage sort-and-delay TDC, the operation carried out by a TDC stage consists of sorting the incoming edges in order of arrival and routing the first to arrive to a first output, and the last to arrive to a second output. The first output is further passed through a delay cell. These two signals, the delayed first output and the second output, form a residue signal that is passed on to the next stage.

FIG. 3 is a schematic block diagram depicting a series of three quantization/residue generator stages (prior art). Repeating the process described in FIG. 2 through several stages with decreasing delays has the effect of bringing the residue signal edges closer together. This is somewhat analogous to the operation of a pipelined or successive approximation ADC. The TDC stage also records the routing decision, and outputs the decision as a digital bit. The digital output of the TDC can be calculated from the output bits of the stages using the knowledge of the magnitudes of the delays in each stage. In its simplest form, the TDC consists of stages with binary delays, with the delay in the first stage being D, in the second D/2, in the third D/4, and so forth. The digital output is simply calculated by performing a Gray-to-binary conversion to a digital word formed from the stage output bits. In practice, some form of trimming may be required to implement the exact delays with precisely binary weights.

It would be advantageous to operate an ADC in parallel with a VTC to coarsely determine a VTDC digital value without the penalty of common mode delay.

SUMMARY OF THE INVENTION

Disclosed herein are a system and method based on the realization that some of the functions conventionally performed by a time-to-digital converter (TDC) can alternatively be performed by an analog-to-digital converter (ADC), when part of a voltage-to-time-to-digital converter (VTDC). The propagation of the analog input signal through the VTC takes some time. A coarse ADC operating in parallel with the VTC can take advantage of this propagation delay, and have a coarse (low resolution) analog-to-digital (A/D) conversion of the input signal available by the time the VTC output reaches the TDC input. This A/D conversion result can be used to assist or speed up the TDC operation.

One aspect of the innovation is to use the coarse A/D conversion result in the front stages of pipelined TDC as a substitute for a signal normally provided by a time-domain quantizer. This result eliminates the wait time associated with the quantizer and makes it possible to remove the quantizer and common mode delay elements that must conventionally be inserted into the signal path. In a sort-and-delay TDC, for example, a one-bit coarse A/D conversion result indicates whether the signal is positive or negative (which edge of a time-differential signal is the leading (or trailing) edge). This A/D conversion result controls the first routing switch in the TDC signal chain. With a higher resolution A/D conversion, subsequent switches in the TDC can be controlled as well. In that case, some degree of matching may be required between the A/D converter quantization levels and TDC delay element sizes, which can be achieved via calibration.

An alternative aspect of the innovation is to use the coarse A/D conversion result to control a dynamic dither generator. A common technique used in ADCs called dithering adds a random or pseudo random signal prior to conversion into the time domain. The benefit is that with added dither any small linearity errors in the TDC signal transfer function become decorrelated from the analog input signal. As a result, such errors appear as wide band noise, instead of discrete tones harmonically related to the TDC input signal, which is often desirable. A digital version of the added dither signal can be subtracted from the TDC output, leaving just the digitized version of the analog input signal. In addition, dynamic dithering may be used to limit the TDC signal range to compensate for the dither signal variations. Limits on the dither signal amplitude, in turn, limit the maximum durations of the time-differential signals, with the magnitude of the dither signal being adjusted in response to ADC signal amplitude. When the ADC supplies a low value, meaning the time-differential signal duration of time is relatively short, the dither signal can be large, and vice versa.

Accordingly, a method is provided for voltage-to-time-to-digital (VTD) conversion using a coarse analog-to-digital converter. The method uses a VTC to receive an analog input voltage-differential signal including a first voltage potential referenced to a second voltage potential. The VTC supplies an analog first time-differential signal with a binary level first edge separated from a binary level second edge by a first duration of time responsive to the difference between the first and second voltage potentials. An ADC receives the input voltage-differential signal and supplies a first digital code representing m bit values. A TDC receives a second time-differential signal with a binary level first edge separated from a binary level second edge by a second by a second duration of time derived from the first duration of time. The TDC supplies an output digital code representing p bit values, where p>m.

In one aspect, the TDC includes m initial residue generator stages forming a residue generator group. Then, the residue generator group accepts the second time-differential signal and the first digital code, and supplies an output time-differential signal having a first edge separated from a second edge by a mth duration of time, where the difference between the second and mth durations of time is responsive to the first digital code m bit values. For example, a first residue stage from the residue group may accept the second time-differential signal and the most significant first digital code bit value. Then, the first residue stage supplies a third time-differential signal having a first edge separated from a second edge by a third duration of time, where the difference between the second and third durations of time is responsive to the most significant first digital code bit value.

Another variation of the method provides a pseudo random signal. A first dither circuit generates the second time-differential signal with a pseudo random second duration of time delay responsive to the first time-differential signal, the first digital code, and the pseudo random signal. Then, supplying the output digital code includes supplying a dithered output digital code, and a dither canceler supplies a decorrelated output digital code responsive to the dither signal and the dithered output digital code. Typically, generating the second time-differential signal with the pseudo random second duration of time includes generating a second time-differential signal with a second duration of time less than or equal to a maximum first duration of time.

In one scenario, supplying the first time-differential signal includes supplying the first time-differential signal with a first duration of time less than the maximum first duration of time. Then, the method adjusts the amplitude of the dither signal in response to the first digital code, and the second time-differential signal is supplied with a maximum second duration of time delay greater than the first duration of time in response to the dither signal amplitude.

In one variation the method provides a pseudo random signal with a digital first peak amplitude, and the dither circuit generates the second time-differential signal responsive to the pseudo random signal as follows. The first peak amplitude is used when the first digital code is a midrange value. A second peak amplitude is used, less than the first peak amplitude, when the first digital code is an upper range value. A third peak amplitude is used, less than the first peak amplitude, when the first digital code is a lower range value.

Alternatively, the method provides a pseudo random signal with a digital first peak amplitude having equal positive and negative polarities, and the dither circuit generates the second time-differential signal responsive to the pseudo random signal as follows. A second peak amplitude is used, less than the first peak-to-peak amplitude, when the first digital code is a midrange value. A third, primarily negative polarity, peak amplitude is used when the first digital code is an upper range value. A fourth, primarily positive polarity, peak amplitude is used when the first digital code is a lower range value.

Additional details of the above-described methods and associated systems are provided below.

DETAILED DESCRIPTION

Figure 1:
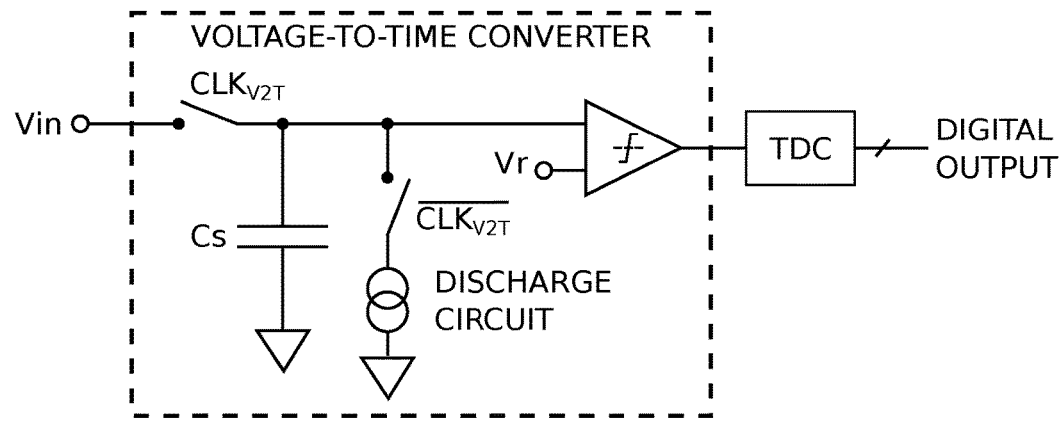
FIG. 1 is a simplified schematic of an ADC comprised of a voltage-to-time (V2T) converter (VTC) and a time-to-digital converter (TDC) based upon a single slope principle (prior art).
Figure 2:
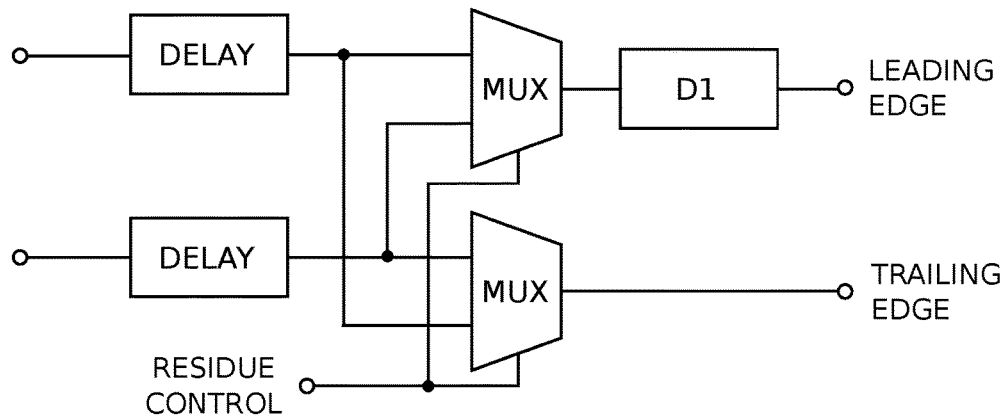
FIG. 2 is a schematic block diagram of a sort-and-delay residue generator stage (prior art).
Figure 3:
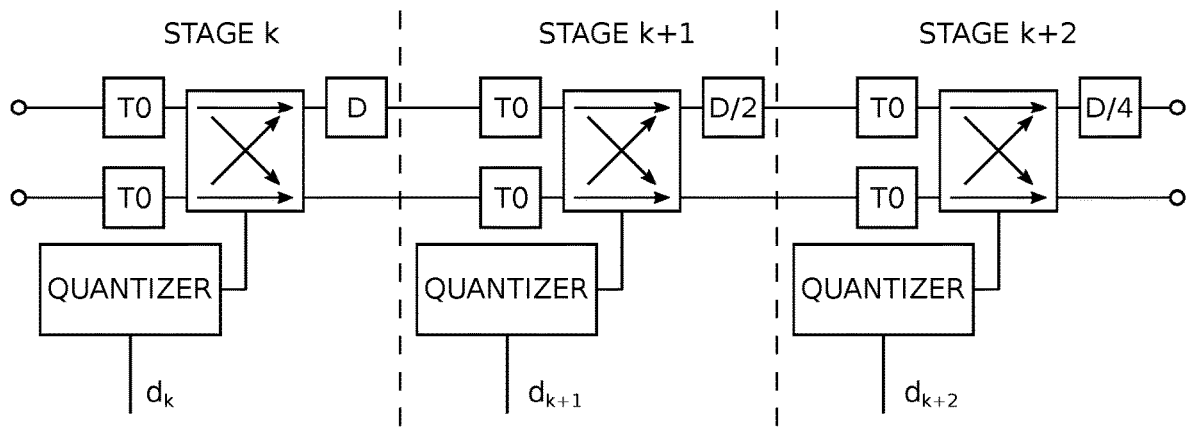
FIG. 3 is a schematic block diagram depicting a series of three quantization/residue generator stages (prior art).
Figure 4:
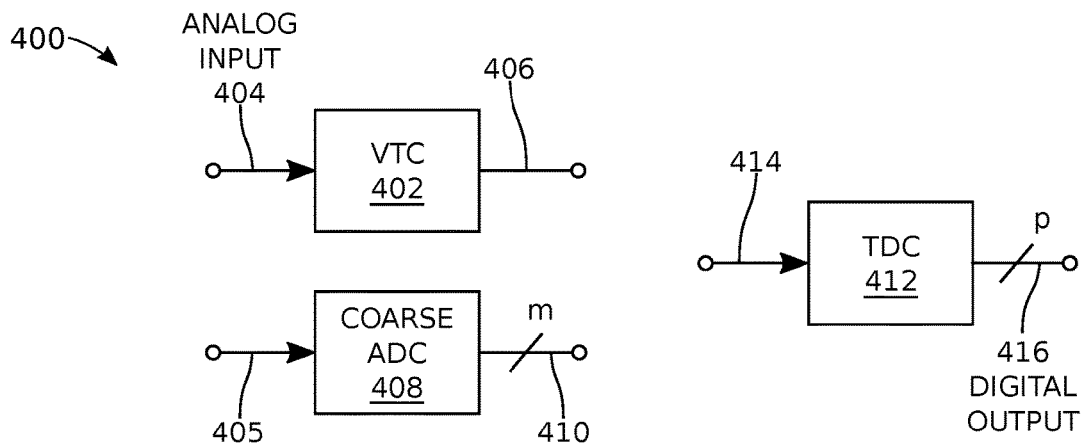
FIG. 4 is a schematic block diagram depicting a voltage-to-time-to-digital converter (VTDC) with a coarse analog-to-digital converter (ADC).

FIG. 4 is a schematic block diagram depicting a voltage-to-time-to-digital converter (VTDC) with a coarse analog-to-digital converter (ADC). The VTDC 400 comprises a voltage-to-time converter (VTC) 402 having an input on line 404 to accept an analog input voltage-differential signal comprising a first voltage potential referenced to a second voltage potential, and an output on line 406 to supply an analog first time-differential signal. The first time-differential signal comprises a binary level first edge separated from a binary level second edge by a first duration of time, responsive to the difference between the first and second voltage potentials. An analog-to-digital converter (ADC) 408 has an input on line 405 to accept the input voltage-differential signal, and an output on line 410 to supply a first digital code representing m bit values. The coarse ADC 408 can be enabled as a flash type ADC, which in the case of a single bit ADC reduces to one comparator. However, the VTDC is not limited to any particular type of ADC.

A time-to-digital converter (TDC) 412 has an input on line 414 to accept a second time-differential signal comprising a binary level first edge separated from a binary level second edge by a second by a second duration of time derived from the first duration of time, as explained in more detail below. The TDC 412 has an output on line 416 to supply an output digital code representing p bit values, where p>m.

Figure 5A:
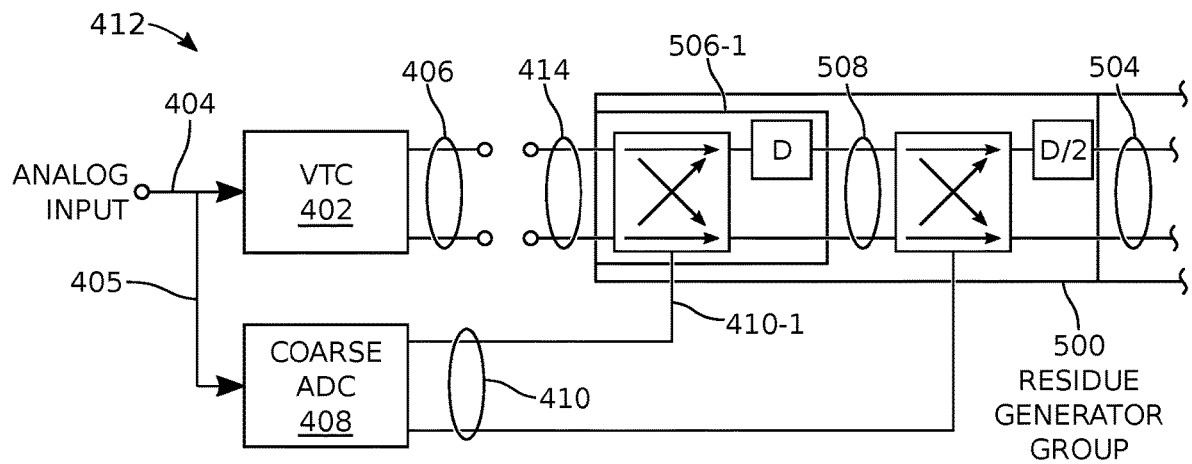
FIGS. 5A through 5C are schematic block diagrams depicting a first implementation of the VTDC of FIG. 4.
Figure 5B:
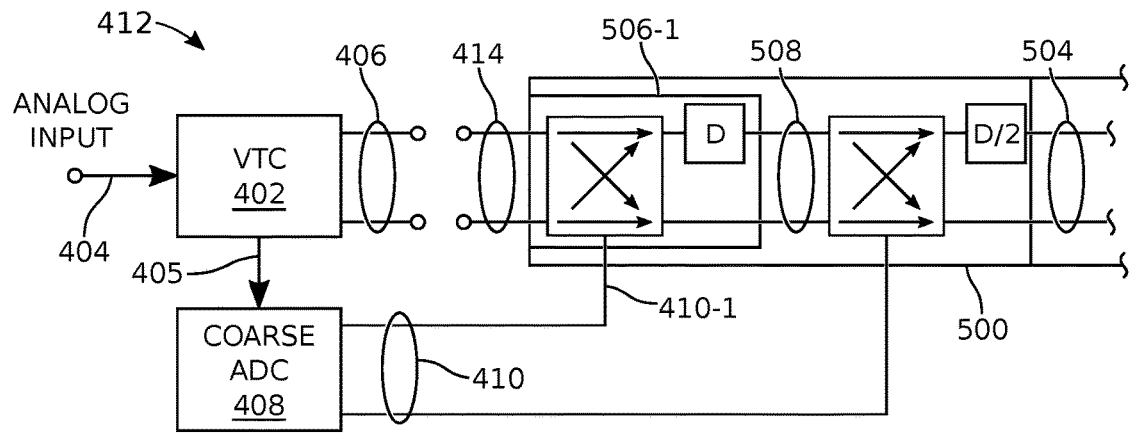
Figure 5C:
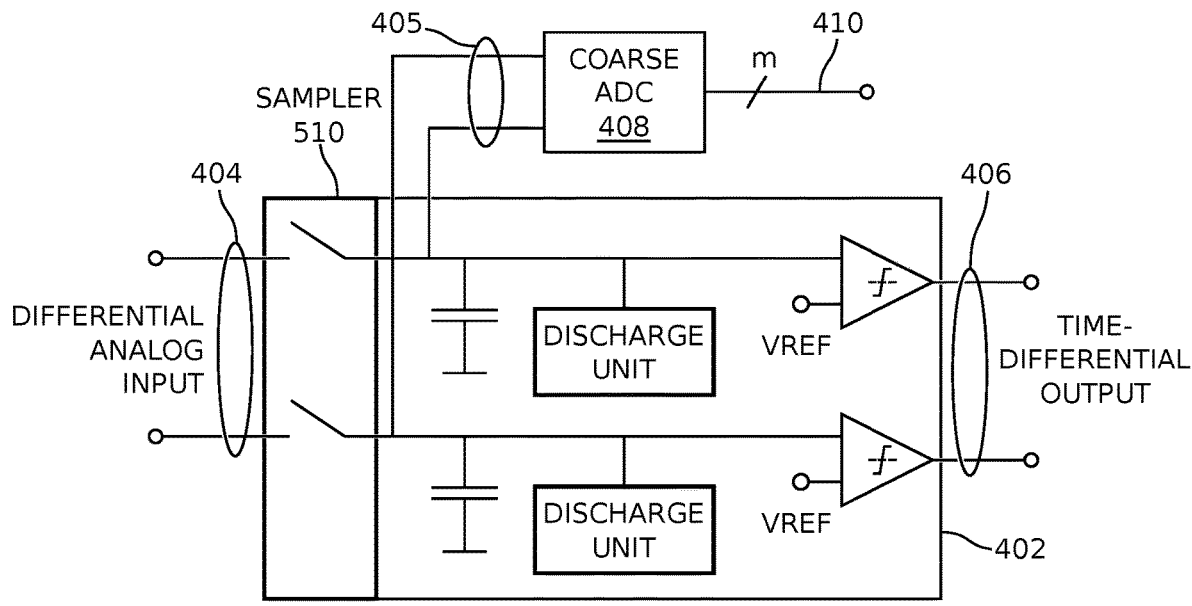

FIGS. 5A through 5C are schematic block diagrams depicting a first implementation of the VTDC of FIG. 4. In FIG. 5A, the inputs to the VTC 402 and ADC 408 are identical (lines 404 and 405 are the same line). In FIGS. 5B and 5C, the analog input signal on line 404 is sampled by the VTC 402, and the samples are provided to the ADC 408 on line 405. When the sampler 510 is made part of the VTC 402, the coarse ADC 408 is connected to VTC to receive the sampled signals on line 405, but otherwise operates independently from the VTC. The ADC 408 timing must be synchronized with the sampler 510, which can be accomplished using jointly generated clock signals (not shown).

In common with both FIGS. 5A and 5B, the first and second time-differential signals are the same, so lines 406 and 414 are the same lines. The TDC 412 includes m initial residue generator stages 506-1 through 506-m forming a residue generator group 500 having an input to accept the second time-differential signal on line 406/414, and a control input on line 410 to accept the first digital code. The residue generator group 500 has an output on line 504 to supply an output time-differential signal having a first edge separated from a second edge by a mth duration of time. In this example, m=2. The difference between the second and mth durations of time is responsive to the first digital code m bit values.

More explicitly, a first residue stage 506-1 from the residue generator group 500 has a signal input to accept the second time-differential signal on line 406/414, a control input on line 410-1 to receive the most significant first digital code bit value, and a signal output to supply a third time-differential signal on line 508 having a first edge separated from a second edge by a third duration of time. The difference between the second and third durations of time is responsive to the most significant first digital code bit value.

Figure 6:
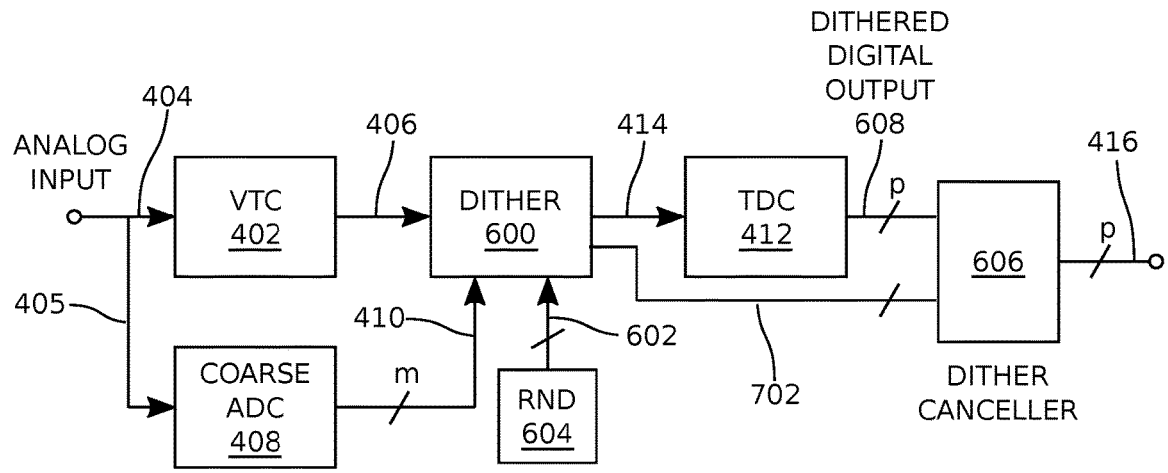
FIG. 6 is a schematic block diagram depicting a second variation of the VTDC of FIG. 4.

FIG. 6 is a schematic block diagram depicting a second variation of the VTDC of FIG. 4. A first dither circuit 600 has an input on line 406 to accept the first time-differential signal, an input to accept the first digital code on line 410, and an input to accept a digital pseudo random signal on line 602 from a random signal generator (RND) 604. The dither circuit 600 has an output on line 414 to supply the second time-differential signal with a pseudo random second duration of time delay responsive to the first time-differential signal, the first digital code, and the pseudo random signal.

Figure 7A:
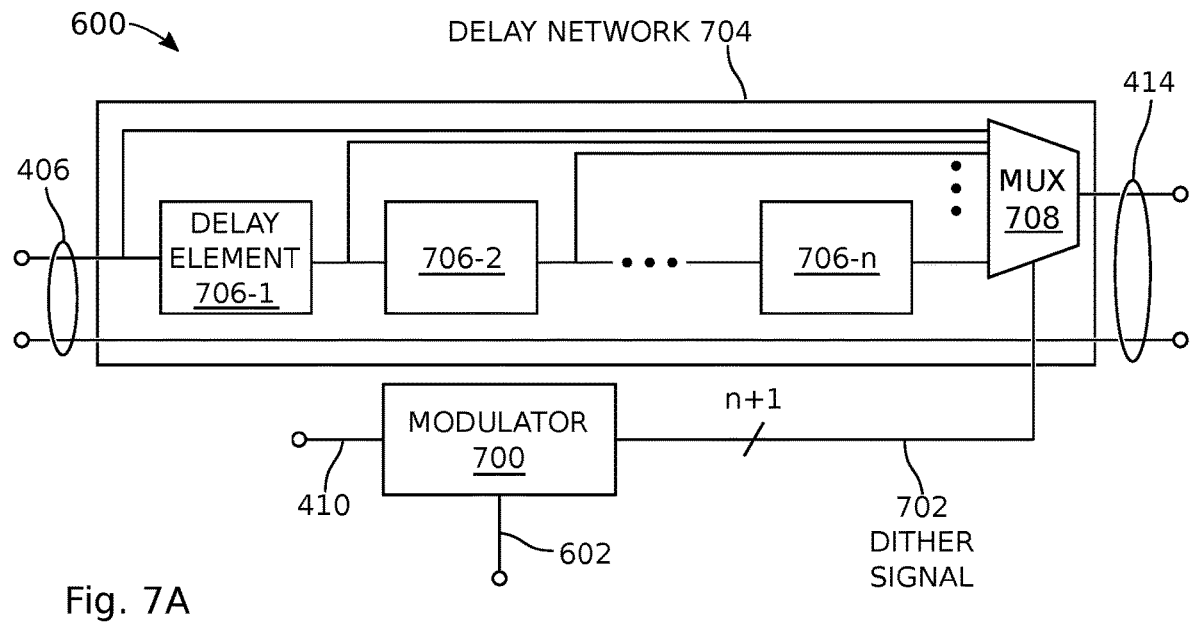
FIGS. 7A and 7B are schematic block diagrams depicting the dither circuit of FIG. 6 in greater detail.
Figure 7B:
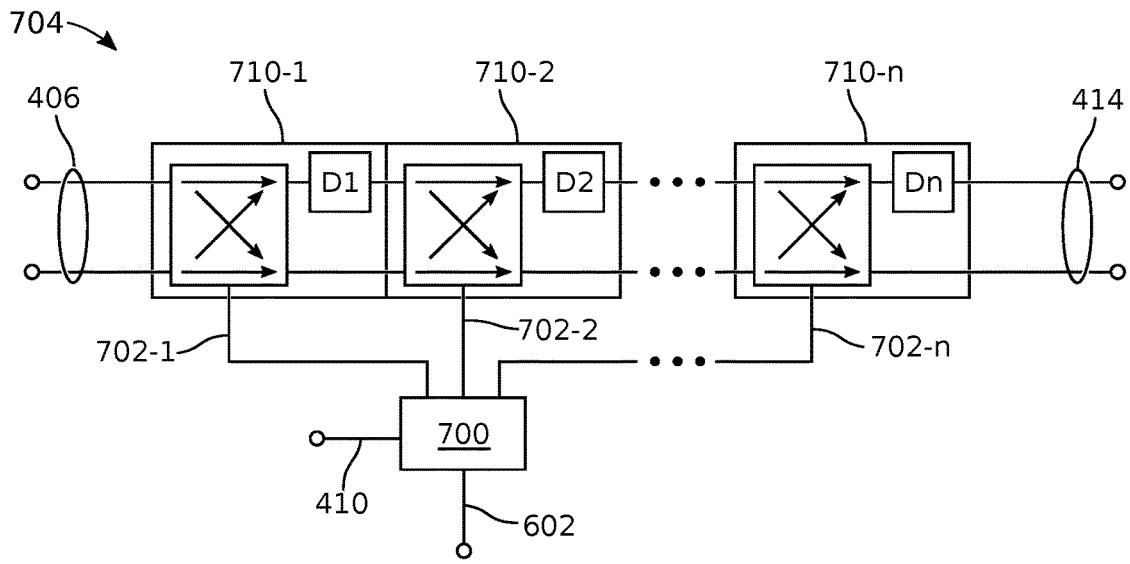

FIGS. 7A and 7B are schematic block diagrams depicting the dither circuit of FIG. 6 in greater detail. A modulator 700 has an input on line 410 to accept the first digital code, an input to accept the pseudo random signal on line 602, and an output to supply a digital dither signal on line 702. A delay network 704 has an input to accept the first time-differential signal on line 406 and an input on line 702 to accept the dither signal. The delay network 704 creates the second time-differential signal on line 414 in response to the dither signal, with a maximum second duration of time less than or equal to a maximum first time duration. Here the delay network 704 is depicted as n series connected delays elements 706-1 through 706-n and multiplexor 708, but alternatively, the delays may be connected in parallel. The delay network is not limited to any particular means of implementing a delay into a time-differential signal. FIG. 7B depicts the delay network 704 implemented as a series of cross point switched delay stages 710-1 through 710-n controlled by the bits of the dither signal. The dither circuit is not limited to any particular delay network implementation.

Returning briefly to FIG. 6, a dither canceler 606 has an input on line 608 to accept a dithered output digital code, an input to accept the dither signal 702 from the dither circuit 600, and an output on line 416 to supply a decorrelated output digital code responsive to the dither signal.

Figure 8:
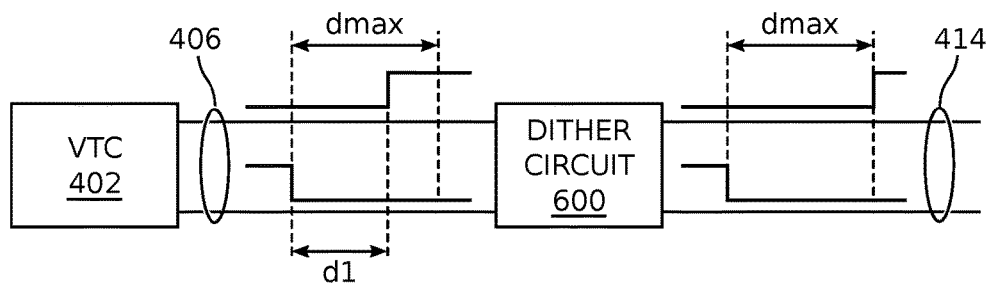
FIG. 8 is a diagram depicting a maximum second time-differential signal duration.

FIG. 8 is a diagram depicting a maximum second time-differential signal duration. In one scenario, the VTC supplies the first time-differential signal on line 406, at a first time, with a first time duration (d1) less than a maximum first time duration (dmax). Referencing FIGS. 7A, 7B, and 8, the modulator 700 supplies a dither signal on line 702 with an amplitude (a digital value) responsive to the first digital code on line 410. The delay network 704 supplies the second time-differential signal with the maximum second duration of time (dmax) at the first time, greater than the first duration of time (d1), responsive to the combination of the dither signal amplitude and the first duration of time. It should be understood that due to dithering, the second duration of time is not always the maximum value, and so is not always longer in duration than the first duration of time.

In one aspect, the modulator 700 accepts the pseudo random signal with a digital first peak amplitude and adjusts the pseudo random signal to supply the first peak amplitude when the first digital code is a midrange value. When the first digital code is an upper range value (corresponding to relatively long first duration of time), the pseudo random signal is adjusted to supply a second peak amplitude, less than the first peak amplitude. This adjustment prevents the second time duration from ever exceeding dmax. When the first digital code is a lower range value, the pseudo random signal is adjusted to supply a third peak amplitude, less than the first peak amplitude, which prevents the second time duration from becoming inconveniently short.

For example, the coarse ADC may supply a first digital code that is high positive, in the middle, or high negative. These levels are represented with codes +1, 0, and −1. The pseudo random signal can be any integer value between −3 and +3. Then, the modulator may work as follows: when the first digital code is 0, the modulator passes the random signal though unaltered. When the first digital code is +1 or −1, it scales the random signal down to range −1 to +1. This is a symmetrical approach.

If the modulator accepts a pseudo random signal with a digital first peak amplitude having equal positive and negative polarities, the pseudo random signal is adjusted to supply a second peak amplitude, less than the first peak amplitude, when the first digital code is a midrange value. When the first digital code is an upper range value, the pseudo random signal is adjusted to supply a third, primarily negative polarity, peak amplitude. When the first digital code is a lower range value, the pseudo random signal is adjusted to supply a fourth, primarily positive polarity, peak amplitude.

This asymmetrical modulation may, for example, work as follows: when the first digital code is +1, the modulator output ranges from −3 to 0. When the first digital code is 0, the modulator output takes values from −1 to +1, and when the first digital code is −1 the modulator output ranges from 0 to +3.

Adding the dither to the first time differential signal essentially consists of two steps: converting the digital dither signal from digital to time, and adding it to the first time-differential signal. The task of the modulator is to prevent the sum (time duration) from getting too large or too small for the TDC to handle. In the symmetrical example, the maximum sum may be larger than the value of the first time-differential signal by the amount equivalent of one digital level of the random signal. In the asymmetrical example, the sum is never larger than the value of the first time-differential signal.

The larger the amplitude of the dither signal, the more effective it is. As the signal appearing at the dither circuit output is the sum of the dither signal and the first time-differential signal, the ADC signal range must be limited to compensate for the dither signal variations, which in turn limits the maximum second time duration and thus limits signal-to-noise ratio improvements. As explained above, one solution to avoid this range limitation is to use dynamic dithering. The magnitude of the dither signal is adjusted based on the amplitude of the first digital code from the ADC. When the first digital code is a low value (the first duration of time is relatively short), the dither signal can be large and vice versa.

Conventionally, dynamic dithering requires information concerning the input voltage domain signal, which is not normally available. However, in the circuits described above the first digital code provided by the ADC is able to support dynamic dithering with a minimum of second time duration limitations. That is, with a coarse ADC operating in parallel with the VTC, the signal information needed to control a dynamic dither circuit becomes available assuming that the signal propagation delay through the coarse ADC is less than the delay through the VTC. In the dither generator the coarse A/D conversion result can be used to modulate the amplitude of a pseudo random signal and the resulting dither signal is added to the TDC input to create the second time-differential signal. As described above, the amplitude and polarity of the dither signal can be adjusted based upon the first digital code supplied by the ADC to keep the TDC input (the second duration of time) within valid input range.

When the coarse ADC is used to control dynamic dithering, it can be useful to have its quantization levels tailored for this purpose. For instance, the coarse ADC may have two quantization levels: one set 20% below the maximum input voltage differential level and another 20% above the minimum voltage differential level. This setup defies three regions for the input signal: top 20%, middle 60%, and bottom 20%.

Figure 9:
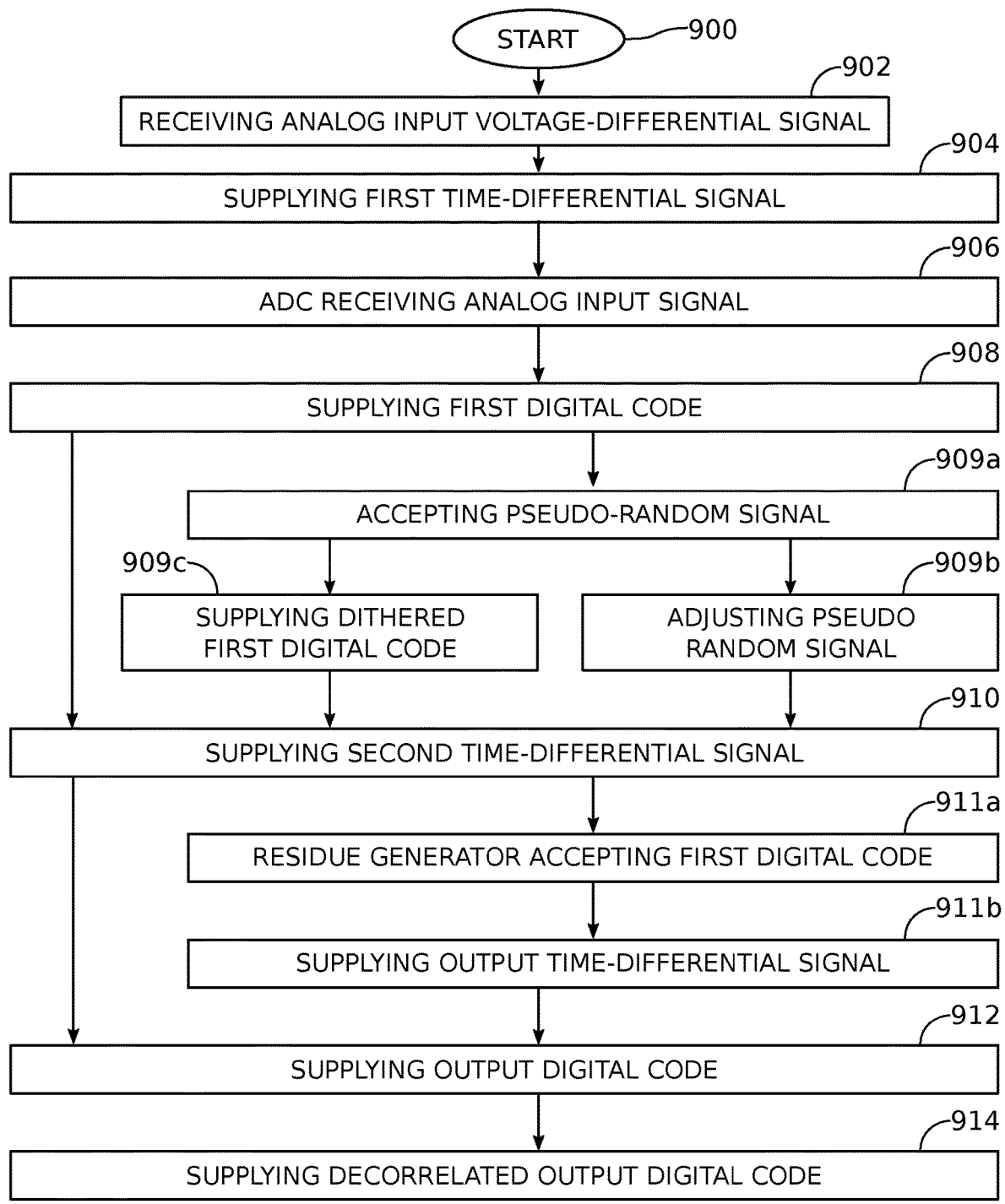
FIG. 9 is a flowchart illustrating a method for voltage-to-time-to-digital (VTD) conversion using a coarse ADC.

FIG. 9 is a flowchart illustrating a method for voltage-to-time-to-digital (VTD) conversion using a coarse ADC. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 900.

In Step 902 a voltage-to-time converter receives an analog input voltage-differential signal comprising a first voltage potential referenced to a second voltage potential. In Step 904 the VTC supplies an analog first time-differential signal comprising a binary level first edge separated from a binary level second edge by a first duration of time, responsive to the difference between the first and second voltage potentials. In Step 906 an ADC receives the input voltage-differential signal and supplies a first digital code representing m bit values in Step 908. In Step 910 a time-to-digital converter receives a second time-differential signal comprising a binary level first edge separated from a binary level second edge by a second by a second duration of time derived from the first duration of time. In Step 912 the TDC supplies an output digital code representing p bit values, where p>m.

In one aspect, the TDC receiving the second time differential signal in Step 910 includes m initial residue generator stages forming a residue generator group to accept the second time-differential signal. Then, in Step 911a the residue generator group accepts the first digital code, and in Step 911b the residue generator group supplies an output time-differential signal having a first edge separated from a second edge by a mth duration of time, where the difference between the second and mth durations of time is responsive to the first digital code m bit values.

More explicitly, in Step 910 a first residue stage from the residue group may accept the second time-differential signal, and in Step 911a the first residue stage receives the most significant first digital code bit value. Then, in Step 911b the first residue stage supplies a third time-differential signal having a first edge separated from a second edge by a third duration of time, where the difference between the second and third durations of time is responsive to the most significant first digital code bit value.

In another aspect of the method, Step 909a accepts a digital pseudo random signal. In Step 910 a first dither circuit supplies the second time-differential signal with a pseudo random second duration of time delay responsive to the first time-differential signal, the first digital code, and the pseudo random signal. Step 912 then supplies a dithered output digital code. In Step 914 a dither canceler supplies a decorrelated output digital code responsive to the dither signal and the dithered output digital code.

Typically, supplying the second time-differential signal with the pseudo random second duration of time includes generating a second time-differential signal with a second duration of time less than or equal to a maximum first duration of time. In one scenario, supplying the first time-differential signal in Step 904 includes supplying the first time-differential signal, at a first time, with a first duration of time less than the maximum first duration of time. Step 909b adjusts the amplitude of the dither signal at the first time in response to the first digital code. Step 910 then supplies the second time-differential signal at the first time with a maximum second duration of time delay greater than the first duration of time in response to the dither signal amplitude. Alternatively stated, the second duration of time is potentially greater than the first duration of time.

If Step 909a accepts a pseudo random signal with a digital first peak amplitude, in Step 909b the dither circuit supplies the second time-differential signal responsive to the pseudo random signal as follows:

the first peak amplitude when the first digital code is a midrange value;

a second peak amplitude, less than the first peak amplitude, when the first digital code is an upper range value; or, a third peak amplitude, less than the first peak amplitude, when the first digital code is a lower range value.

If Step 909a supplies a pseudo random signal with a digital first peak amplitude having equal positive and negative polarities, in Step 909b the dither circuit supplies the second time-differential signal responsive to the pseudo random signal as follows:

a second peak amplitude, less than the first peak amplitude, when the first digital code is a midrange value;

a third, primarily negative polarity, peak amplitude when the first digital code is an upper range value; or, a fourth, primarily positive polarity, peak amplitude when the first digital code is a lower range value.

VTDC systems and methods have been provided. Examples of particular combinational logic, delay, routing, and decision structures have been presented to illustrate the invention. However, the invention is not limited to merely these examples. Other variations and embodiments of the invention will occur to those skilled in the art.

I claim:

1. A voltage-to-time-to-digital converter (VTDC) with a coarse analog-to-digital converter (ADC), the VTDC comprising:
   a voltage-to-time converter (VTC) having an input to accept an analog input voltage-differential signal comprising a first voltage potential referenced to a second voltage potential, and an output to supply an analog first time-differential signal comprising a binary level first edge separated from a binary level second edge by a first duration of time responsive to the difference between the first and second voltage potentials;
   an analog-to-digital converter (ADC) having an input to accept the input voltage-differential signal, and an output to supply a first digital code representing m bit values; and,
   a time-to-digital converter (TDC) having an input to accept a second time-differential signal comprising a binary level first edge separated from a binary level second edge by a second by a second duration of time derived from the first duration of time, and an output to supply an output digital code representing p bit values, where p>m.

2. The VTDC of claim 1 wherein the TDC includes m initial residue generator stages forming a residue generator group having an input to accept the second time-differential signal, a control input to accept the first digital code, and an output to supply an output time-differential signal having a first edge separated from a second edge by a mth duration of time, where the difference between the second and mth durations of time is responsive to the first digital code m bit values.

3. The VTDC of claim 2 wherein a first residue stage from the residue generator group has a signal input to accept the second time-differential signal, a control input to receive the most significant first digital code bit value, and a signal output to supply a third time-differential signal having a first edge separated from a second edge by a third duration of time, where the difference between the second and third durations of time is responsive to the most significant first digital code bit value.

4. The VTDC of claim 1 further comprising:
   a first dither circuit having an input to accept the first time-differential signal, and input to accept the first digital code, an input to accept a digital pseudo random signal, and an output to supply the second time-differential signal with a pseudo random second duration of time delay responsive to the first time-differential signal, the first digital code, and the pseudo random signal.

5. The VTDC of claim 4 wherein the first dither circuit comprises:
   a modulator having an input to accept the first digital code, an input to accept the pseudo random signal, and an output to supply a digital dither signal; and,
   a delay network having an input to accept the first time-differential signal and an input to accept the dither signal, the delay network creating the second time-differential signal in response to the dither signal, with a maximum second duration of time less than or equal to a maximum first time duration.

6. The VTDC of claim 5 further comprising:
   a first dither canceler having an input to accept a dithered output digital code, an input to accept the dither signal from the first dither circuit, and an output to supply a decorrelated output digital code responsive to the dither signal.

7. The system of claim 5 wherein the VTC supplies the first time-differential signal, at a first time, with a first time duration less than the maximum first time duration;
   wherein the modulator supplies a dither signal, at the first time, with an amplitude responsive to the first digital code; and,
   wherein the delay network supplies the second time-differential signal, at the first time, with the maximum second duration of time greater than the first duration of time, responsive to the combination of the dither signal amplitude and the first duration of time.

8. The system of claim 7 wherein the modulator accepts the pseudo random signal with a digital first peak amplitude and adjusts the pseudo random signal to supply a pseudo random signal as follows:
   with the first peak amplitude when the first digital code is a midrange value;
   with a second peak amplitude, less than the first peak amplitude, when the first digital code is an upper range value; and,
   with a third peak amplitude, less than the first peak amplitude, when the first digital code is a lower range value.

9. The system of claim 7 wherein the modulator accepts the pseudo random signal with a digital first peak amplitude having equal positive and negative polarities, and adjusts the pseudo random signal to supply a pseudo random signal as follows:
   with a second peak amplitude, less than the first peak amplitude, when the first digital code is a midrange value;
   with a third, primarily negative polarity, peak amplitude when the first digital code is an upper range value; and,
   with a fourth, primarily positive polarity, peak amplitude when the first digital code is a lower range value.

10. The VTDC of claim 1 wherein the VTC comprises a sampler having an input to accept the analog input voltage-differential signal and an output to supply a sampled analog voltage-differential signal; and, wherein the ADC accepts the sampled input voltage-differential signal.

11. A method for voltage-to-time-to-digital (VTD) conversion using a coarse analog-to-digital converter (ADC), the method comprising:

a voltage-to-time converter (VTC) receiving an analog input voltage-differential signal comprising a first voltage potential referenced to a second voltage potential;

the VTC supplying an analog first time-differential signal comprising a binary level first edge separated from a binary level second edge by a first duration of time, responsive to the difference between the first and second voltage potentials;

an analog-to-digital converter (ADC) receiving the input voltage-differential signal;

the ADC supplying a first digital code representing m bit values;

a time-to-digital converter (TDC) receiving a second time-differential signal comprising a binary level first edge separated from a binary level second edge by a second by a second duration of time derived from the first duration of time; and, the TDC supplying an output digital code representing p bit values, where p>m.

12. The method of claim 11 wherein the TDC receiving the second time differential signal includes m initial residue generator stages forming a residue generator group to accept the second time-differential signal;

the method further comprising:

the residue generator group accepting the first digital code; and, the residue generator group supplying an output time-differential signal having a first edge separated from a second edge by a mth duration of time, where the difference between the second and mth durations of time is responsive to the first digital code m bit values.

13. The method of claim 12 wherein the TDC receiving the second time differential signal includes a first residue stage from the residue group accepting the second time-differential signal;

wherein the residue generator group accepting the first digital code includes the first residue stage receiving the most significant first digital code bit value; and, wherein the residue generator group supplying the output time-differential signal includes the first residue stage supplying a third time-differential signal having a first edge separated from a second edge by a third duration of time, where the difference between the second and third durations of time is responsive to the most significant first digital code bit value.

14. The method of claim 11 further comprising:
accepting a digital pseudo random signal;
wherein the TDC receiving a second time-differential signal includes a first dither circuit supplying the second time-differential signal with a pseudo random second duration of time delay responsive to the first time-differential signal, the first digital code, and the pseudo random signal; and, wherein supplying the output digital code includes supplying a dithered output digital code.

15. The method of claim 14 wherein supplying the second time-differential signal with the pseudo random second duration of time includes supplying a second time-differential signal with a second duration of time less than or equal to a maximum first duration of time.

16. The method of claim 15 further comprising:
a first dither canceler supplying a decorrelated output digital code responsive to the dither signal and the dithered output digital code.

17. The method of claim 15 wherein the supplying the first time-differential signal includes supplying the first time-differential signal, at a first time, with a first duration of time less than the maximum first duration of time;

the method further comprising:
adjusting an amplitude of the dither signal, at the first time, in response to the first digital code; and, wherein supplying the second time-differential signal includes supplying the second time-differential signal, at the first time, with a maximum second duration of time delay greater than the first duration of time in response to the dither signal amplitude.

18. The method of claim 17 wherein accepting the pseudo random signal includes accepting a pseudo random signal with a digital first peak amplitude;

wherein the dither circuit supplying the second time-differential signal responsive to the pseudo random signal includes:

using the first peak amplitude when the first digital code is a midrange value;

using a second peak amplitude, less than the first peak amplitude, when the first digital code is an upper range value; and, using a third peak amplitude, less than the first peak amplitude, when the first digital code is a lower range value.

19. The method of claim 17 wherein accepting the pseudo random signal includes accepting a pseudo random signal with a digital first peak amplitude having equal positive and negative polarities:

wherein the first dither circuit supplying the second time-differential signal responsive to the pseudo random signal includes:

using a second peak amplitude, less than the first peak amplitude, when the first digital code is a midrange value;

using a third, primarily negative polarity, peak amplitude when the first digital code is an upper range value; and, using a fourth, primarily positive polarity, peak amplitude when the first digital code is a lower range value.

* * * * *